(12) United States Patent
Lee et al.

(10) Patent No.: US 8,623,735 B2
(45) Date of Patent: Jan. 7, 2014

(54) METHODS OF FORMING SEMICONDUCTOR DEVICES HAVING CAPACITOR AND VIA CONTACTS

(75) Inventors: Ki Young Lee, Poughquag, NY (US); Sanggil Bae, Poughkeepsie, NY (US); Tony Joung, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/232,075

(22) Filed: Sep. 14, 2011

(65) Prior Publication Data

US 2013/0065375 A1   Mar. 14, 2013

(51) Int. Cl.
*H01L 21/20* (2006.01)

(52) U.S. Cl.
USPC ............. 438/381; 257/296; 257/E21.09

(58) Field of Classification Search
USPC ............. 438/381; 257/296–313, E21.09
See application file for complete search history.

(56) References Cited

U.S. PATENT DOCUMENTS

| | | | |
|---|---|---|---|
| 5,918,135 A | 6/1999 | Lee et al. | |
| 6,333,224 B1 | 12/2001 | Lee | |
| 6,479,850 B2 | 11/2002 | Lee | |
| 6,633,497 B2 | 10/2003 | Nickel | |
| 6,649,464 B2 | 11/2003 | Lee | |
| 6,783,999 B1 | 8/2004 | Lee | |
| 6,806,096 B1 | 10/2004 | Kim et al. | |
| 6,853,003 B2 | 2/2005 | Lee | |
| 6,881,999 B2 | 4/2005 | Lee et al. | |
| 7,084,024 B2 | 8/2006 | Gluschenkov et al. | |
| 7,101,804 B2 | 9/2006 | Choi et al. | |
| 7,232,736 B2 | 6/2007 | Lee | |
| 7,262,065 B2 * | 8/2007 | Mitsui et al. | 438/3 |
| 7,285,490 B2 | 10/2007 | Barth et al. | |
| 7,462,535 B2 | 12/2008 | Lee et al. | |
| 7,465,604 B2 | 12/2008 | Heo | |
| 7,575,984 B2 | 8/2009 | Radigan et al. | |
| 7,615,460 B2 | 11/2009 | Ueda | |
| 7,755,196 B2 | 7/2010 | Barth et al. | |
| 7,989,224 B2 | 8/2011 | Gaidis | |

* cited by examiner

*Primary Examiner* — Tony Tran
(74) *Attorney, Agent, or Firm* — Williams, Morgan & Amerson, P.C.

(57) ABSTRACT

Disclosed herein are various methods of forming semiconductor devices that have capacitor and via contacts. In one example, the method includes forming a first conductive structure and a bottom electrode of a capacitor in a layer of insulating material, forming a layer of conductive material above the first conductive structure and the bottom electrode and performing an etching process on the layer of conductive material to define a conductive material hard mask and a top electrode for the capacitor, wherein the conductive material hard mask is positioned above at least a portion of the first conductive structure. This illustrative method includes the further steps of forming an opening in the conductive material hard mask and forming a second conductive structure that extends through the opening in the conductive material hard mask and conductively contacts the first conductive structure.

22 Claims, 4 Drawing Sheets

METHODS OF FORMING SEMICONDUCTOR DEVICES HAVING CAPACITOR AND VIA CONTACTS

BACKGROUND OF THE INVENTION

1. Field of the Invention

Generally, the present disclosure relates to the manufacturing of sophisticated semiconductor devices, and, more specifically, to various methods of forming semiconductor devices that have capacitor and via contacts.

2. Description of the Related Art

In recent years, as the integration density of semiconductor devices increases, the area occupied by individual devices continues to decrease. Specifically, a capacitor for storing data of a dynamic random access memory (DRAM) is required to have sufficient capacitance irrespective of the decrease in the area occupied by the capacitor. Accordingly, a metal-insulator-metal (MIM) capacitor, in which a lower electrode and an upper electrode are formed of metal and separated by a layer of insulating material, have been used in many integrated circuit products. Additionally, MIM capacitors have been used extensively in semiconductor devices that perform analog-to-digital conversions and digital-to-analog conversions. Conversion between analog signals and digital signals requires that capacitors employed in such conversion processes be stable, i.e., the capacitance of the capacitor must be relatively stable over a range of applied voltages and temperatures. The capacitance of capacitors with polysilicon electrodes tends to be relatively unstable as the capacitance of such capacitor structures tends to vary with changes in temperature and applied voltage. Accordingly, capacitors with polysilicon electrodes are typically not used for such conversion applications.

In forming the upper and lower metal electrodes of a MIM capacitor an etching process is typically performed to pattern a metal layer. However, as the integration density of semiconductor devices has increased over the recent years, it has become more difficult to etch such metal layers. In particular, copper, which has good electro-migration resistance and a desirable low resistivity, is very difficult to etch. Accordingly, various methods for forming the upper and lower metal electrodes through a damascene process, a process which does not involve etching a metal layer, has been proposed. See, for example, U.S. Pat. No. 6,649,464. A copper damascene process generally comprises forming a trench for a copper structure in an insulation layer, forming a sufficient amount of copper to overfill the trench, and removing the excess copper from the substrate, thereby leaving the copper structure in the trench. However, the damascene process used in forming copper based capacitors and conductive lines and vias is a very time-consuming, expensive, multiple step process where chances for creating undesirable defects always exists.

The present disclosure is directed to various methods and of forming semiconductor devices that have MIM capacitors and via contacts.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices that have capacitor and via contacts. In one example, the method includes forming a first conductive structure and a bottom electrode of a capacitor in a layer of insulating material, forming a layer of conductive material above the first conductive structure and the bottom electrode and performing an etching process on the layer of conductive material to define a conductive material hard mask and a top electrode for the capacitor, wherein the conductive material hard mask is positioned above at least a portion of the first conductive structure. This illustrative method includes the further steps of forming an opening in the conductive material hard mask and forming a second conductive structure that extends through the opening in the conductive material hard mask and conductively contacts the first conductive structure. In some illustrative embodiments, the conductive material is a metal.

In another illustrative example, a method is disclosed that includes forming a first conductive structure and a bottom electrode of a capacitor in a layer of insulating material, forming a metal diffusion barrier layer above said conductive copper structure and the bottom electrode, forming a second layer of insulating material above the metal diffusion barrier layer and forming a layer of metal above said second layer of insulating material. In this embodiment, the method further includes the steps of performing an etching process on the layer of metal to define a metal hard mask and a top electrode for the capacitor, wherein the metal hard mask is positioned above at least a portion of the first conductive structure, forming an opening in the metal hard mask, an opening in the second layer of insulating material and an opening in the metal diffusion barrier layer and forming a second conductive structure that conductively contacts the first conductive structure, wherein the second conductive structure extends through the openings in the metal hard mask, the second layer of insulating material and the metal diffusion barrier layer.

BRIEF DESCRIPTION OF THE DRAWINGS

The disclosure may be understood by reference to the following description taken in conjunction with the accompanying drawings, in which like reference numerals identify like elements, and in which.

Figure 1A:
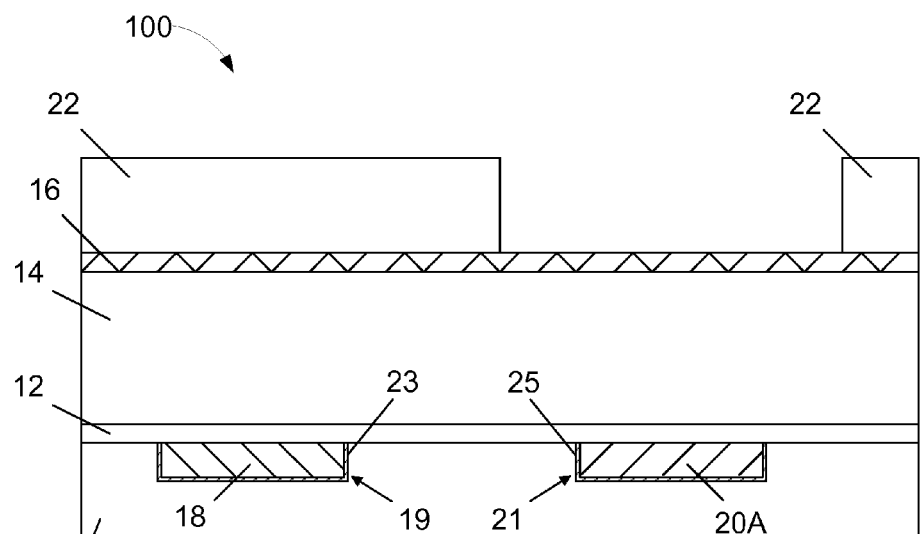
FIGS. 1A-1H depict various illustrative methods of forming semiconductor devices that have capacitor and via contacts as described herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices that have capacitor and via contacts. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 1A-1H, various illustrative embodiments of the methods disclosed herein will now be described in more detail.

FIG. 1A is a simplified view of a portion of an illustrative semiconductor device 100 at an early stage of manufacturing. The device 100 is formed above a semiconducting substrate (not shown). At the point of fabrication depicted in FIG. 1A, the device 100 includes an illustrative first insulating layer 10, a non-conductive diffusion barrier layer 12, a second insulating layer 14, a hard mask layer 16, a patterned mask layer 22, a conductive structure 18, e.g., a conductive line, and a bottom electrode 20A of what will become a MIM capacitor. The various layers depicted in FIG. 1A may be formed from a variety of different materials, and they may be formed by performing a variety of techniques, such as a chemical vapor deposition (CVD), atomic layer deposition (ALD), physical vapor deposition (PVD) or plasma enhanced versions of such processes. The thickness of such layers may also vary depending upon the particular application.

For example, in one illustrative embodiment, the first insulating layer 10 may be comprised of a material such as silicon dioxide, silicon oxynitride, low-k silicon dioxide etc. In one specific example, the first insulating layer 10 may be a layer of silicon dioxide having a thickness of about 400-600 nm that is initially formed by performing a CVD process. As another example, in one illustrative embodiment, the non-conductive diffusion barrier layer 12 may be comprised of a material, such as silicon nitride, NBLoK™, silicon carbide, a nitrogen-doped silicon carbide, etc., that will help prevent or at least reduce any undesirable migration of the conductive materials in the conductive structure 18 and/or the bottom electrode 20A. In one specific example, the non-conductive diffusion barrier layer 12 may be a layer of NBLoK™ having a thickness of about 20-40 nm that is initially formed by performing a CVD process.

Continuing with the discussion of FIG. 1A, in one illustrative embodiment, the second insulating layer 14 may be comprised of a materials such as a so-called low-k insulating material (k value less than 2.7), an ultra-low-k insulating material (k value of less than 2.3), silicon dioxide, OMCTS (Octamethylcyclotetrasiloxane) oxide film, etc. In one specific example, the second insulating layer 14 may be a layer of a low-k insulating material having a thickness of about 700-1000 nm that is initially formed by performing a CVD process. In one illustrative embodiment, the hard mask layer 16 may be comprised of a variety of materials such as, for example, a TEOS based silicon dioxide, silicon nitride, etc. In one specific example, the hard mask layer 16 may be a layer of TEOS based silicon dioxide having a thickness of about 30-40 nm that is initially formed by performing a CVD process. Among other things, the hard mask layer 16 acts to protect the underlying second layer of insulating material 14. It should also be noted that, if desired or warranted by a particular process flow, an additional hard mask layer (not shown) may be formed above the hard mask layer 16. If such an additional hard mask layer were to be employed it may be made of a variety of material and it may have an increased hardness relative to the hardness of the hard mask layer 16. The patterned mask layer 22 may be comprised of a variety of material, e.g., a photoresist material, and it may be formed using known photolithography techniques.

Still referring to FIG. 1A, the schematically depicted conductive structure 18 may be comprised of a variety of conductive materials such as copper, copper manganese, silver, etc., and it may be formed using a variety of known techniques. In one specific example, the conductive structure 18 is a copper line that is formed using known damascene techniques. The conductive structure 18 may be part of the overall metallization system for the device 100. Of course, the size, shape and configuration of the conductive structure 18 may vary depending upon the particular application. In one specific example, the conductive structure 18 may have a thickness that ranges from about 40-60 nm. So as not to obscure the present inventions, some details and layers associated with the formation of the conductive structure 18 may not be depicted in the drawings. In certain embodiments, one or more barrier layers 23 may be formed in the trench 19 prior to depositing the conductive material, e.g., copper in the trench 19. Similarly, the bottom electrode 20A may be comprised of a variety of conductive materials such as copper, copper manganese, silver, etc., and it may be formed using a variety of techniques. The thickness of the bottom electrode 20A may also vary depending upon the particular application. In one illustrative embodiment, the bottom electrode 20A may be comprised of copper, it may be formed using known damascene techniques, and it may have a thickness of about 40-60 nm. The lateral width of the bottom electrode 20A may also vary depending upon the particular application. Also similar to the conductive structure 18, one or more barrier layers 25 may be formed in a trench 21 as part of the process of forming the bottom electrode 20A.

Figure 1B:
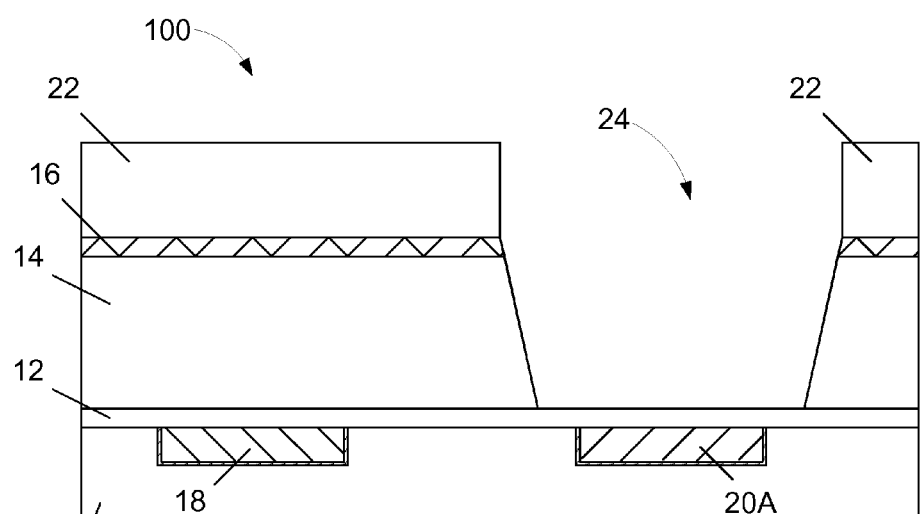

Next, as shown in FIG. 1B, one or more etching processes are performed through the patterned mask layer 22 to define the opening 24. Either dry or wet etching processes may be employed in forming the opening 24. In one illustrative embodiment, the opening 24 if formed by performing dry anisotropic etching processes to define the opening 24, with appropriate changes in the etch chemistry of such etching processes as may be required to etch through the hard mask layer 16 and the second layer of insulating material 14. The size and configuration of the opening 24 may vary depending upon the particular application.

Figure 1C:
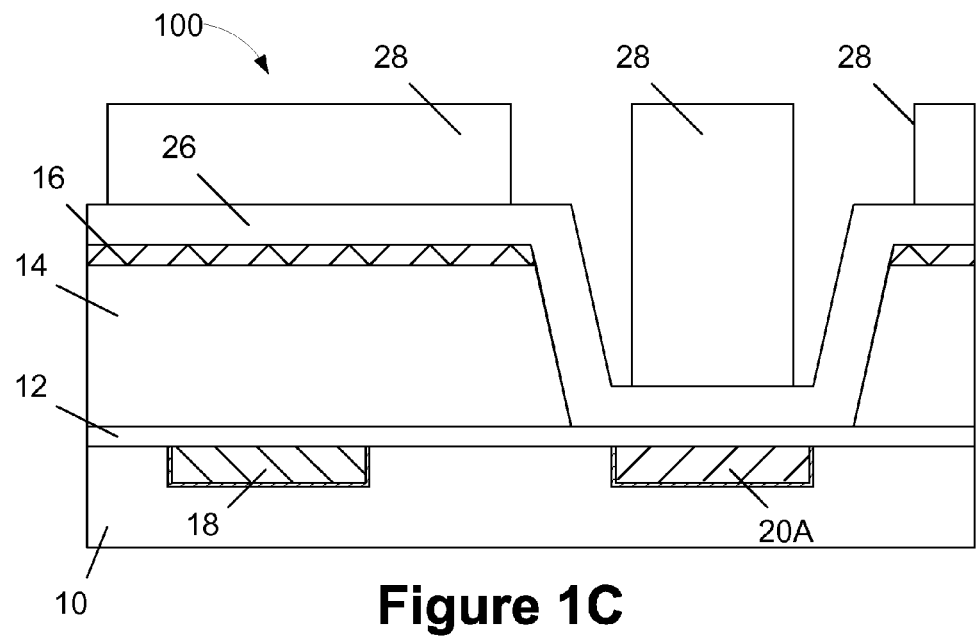

Next, as shown in FIG. 1C, a conductive material layer 26 is formed above the device 100 and in the opening 24. As will be described more fully below, a portion of the conductive material layer 26 will eventually become the upper electrode for the MIM capacitor to be formed on the device 100. The conductive material layer 26 may be comprised of a variety of different materials that may be suitable as an electrode for the MIM capacitor such, for example, titanium, titanium nitride, tantalum, tantalum nitride, etc. In one specific example, the conductive material layer 26 may be a layer of titanium nitride having a thickness of about 30-50 nm that is initially formed by performing a conformal PVD or CVD process. Thereafter, another patterned mask layer 28, e.g., a photoresist mask, is formed above the conductive material layer 26.

Figure 1D:
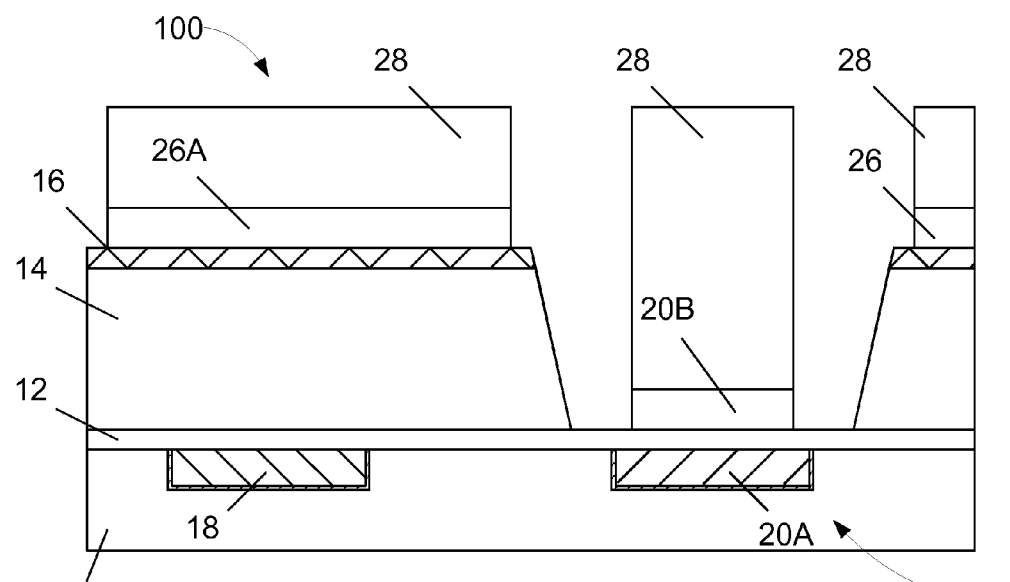

Next, as shown in FIG. 1D, one or more etching processes are performed on the conductive material layer 26 through the patterned mask layer 28 to define a top electrode 20B for the MIM capacitor 20 and to define a conductive material hard mask 26A positioned above the conductive structure 18. Either dry or wet etching processes may be employed in etching the conductive material layer 26. In one illustrative embodiment, the conductive material layer 26 is etched by performing a dry anisotropic etching process. The size and configuration of the top electrode 20B and the conductive material hard mask 26A may vary depending upon the particular application.

Figure 1E:
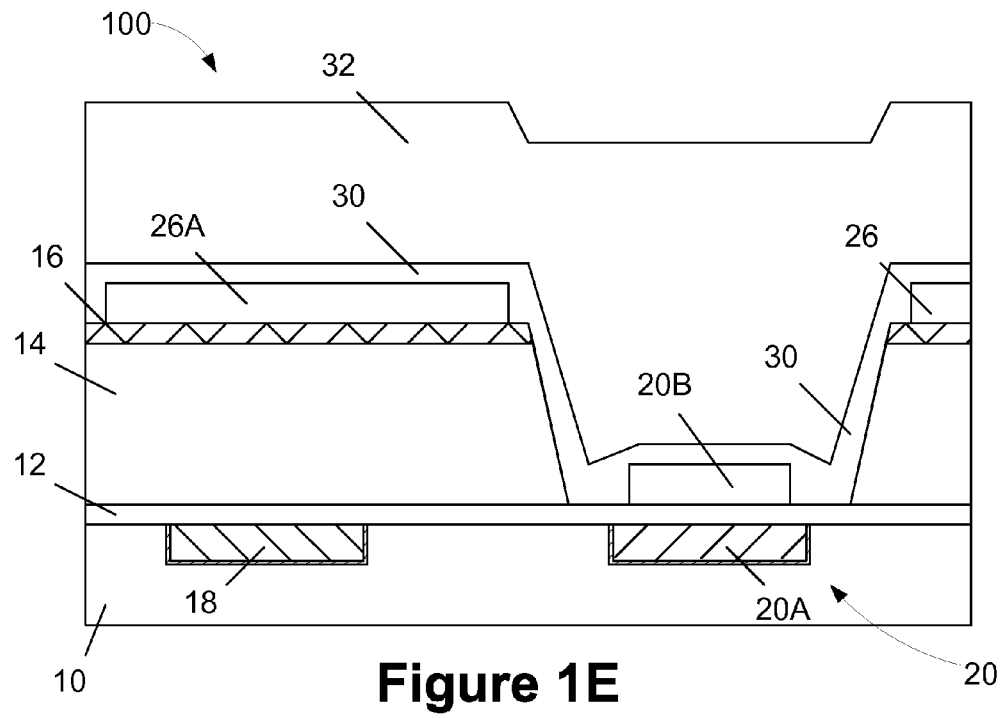

Then, as shown in FIG. 1E, the patterned mask layer 28 is removed and, in one illustrative process flow, a hard mask layer 30 and a third layer of insulating material 32 are formed above the device 100. It should be noted that the hard mask layer 30 may not be employed in all applications. In the illustrative process flow described herein, the hard mask layer 30 will ultimately be used as a polish stop layer when a CMP process is performed to remove portions of the third layer of insulating material 32, as describe more fully below. Thus, in this illustrative example, it may be beneficial to make the hard mask layer 30 from a material that is harder than the material selected for the third layer of insulating material 32. In one illustrative embodiment, the hard mask layer 30 may be comprised of a variety of materials such as, for example, a TEOS based silicon dioxide, silicon nitride, etc. In one specific example, the hard mask layer 30 may be a layer of TEOS based silicon dioxide having a thickness of about 30-50 nm that is initially formed by performing a CVD process. In one illustrative embodiment, the third layer of insulating layer 32 may be comprised of a materials such as a so-called low-k insulating material (k value less than 2.7) or an ultra-low-k insulating material (k value of less than 2.3), etc. In one specific example, the third insulating layer 32 may be a layer of a low-k insulating material having a thickness of about 600-800 nm that is initially formed by performing a CVD process.

Figure 1F:
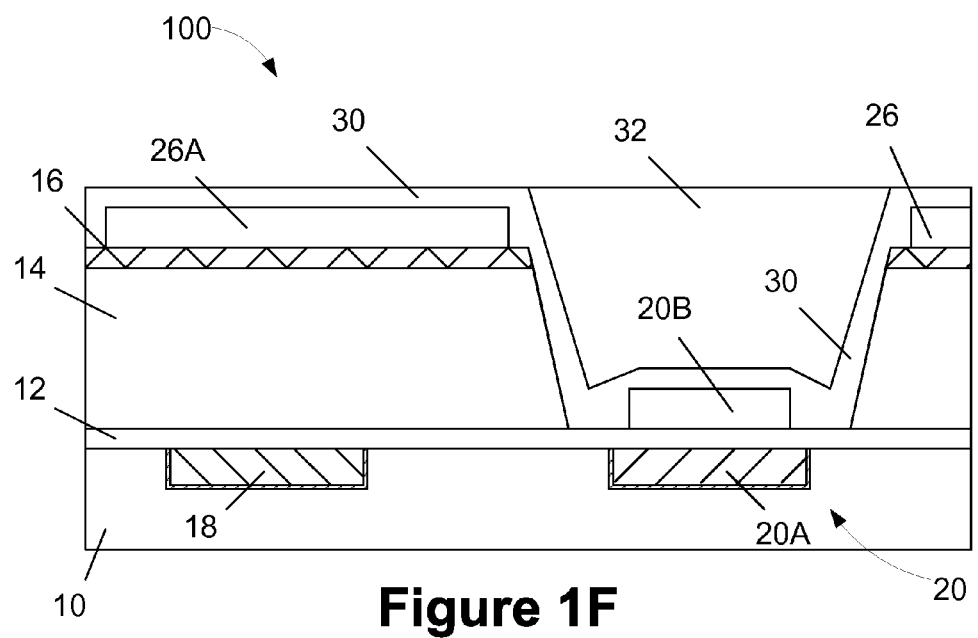

Next, as shown in FIG. 1F, one or more process operations are performed to remove portions of the third layer of insulating material 32. In one illustrative embodiment, a chemical mechanical polishing (CMP) process is performed to remove the excess portions of the third layer of insulating material 32 with the hard mask layer 30 acting as a polish stop layer. In other applications, an etching process may be performed to remove the excess portions of the third layer of insulating material 32. Of course, if desired, a combination of a CMP process and an etching process may be employed in removing portions of the third layer of insulating material 32.

Figure 1G:
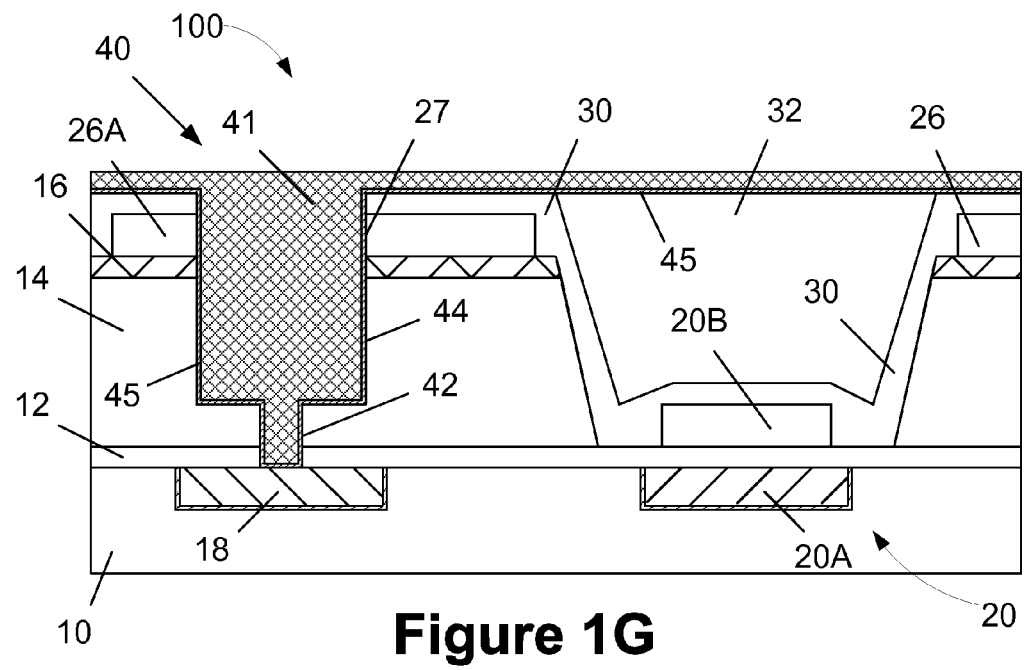

Next, as shown in FIG. 1G, a plurality of process operations are performed to form what will become a conductive structure 40 that will be electrically coupled to the conductive structure 18, e.g., a metal line, positioned in the first layer of insulating material 10. The conductive structure 40 may be comprised of a variety of different materials, e.g., copper, a metal, copper manganese, silver, etc. and it may be formed using a variety of known techniques. Thus, the particular material used for the conductive structure 40 and the manner in which it is formed should not be considered to be a limitation of the present inventions. In one illustrative embodiment, the conductive structure 40 may be comprised of copper and it may be formed by using known damascene processing techniques, such as those shown in U.S. Pat. No. 6,649,464. In general, as noted previously, copper damascene processing generally comprises forming a trench for a copper structure in an insulation layer, forming a sufficient amount of copper to overfill the trench, and removing the excess copper from the substrate, thereby leaving the copper structure in the trench. In the example depicted herein, the conductive structure 40 is formed using a so-called via-first, trench-last technique. Using this technique, a via 42 and a trench 44 are formed through the various material layers depicted in FIG. 1G. This process includes forming an opening 27 through the conductive material hard mask 26A. The via 42 exposes the underlying conductive structure 18. Thereafter, one or more layers of conductive material 41 are formed in the via 42 and the trench 44. So as not to obscure the present inventions, some details and layers associated with the formation of the conductive structure 40 may not be depicted in the drawings. In at least some embodiments, one or more barrier layers 45 may be formed in the via 42 and the trench 44 prior to depositing the conductive material 41, e.g., copper in the via 42 and the trench 44.

Figure 1H:
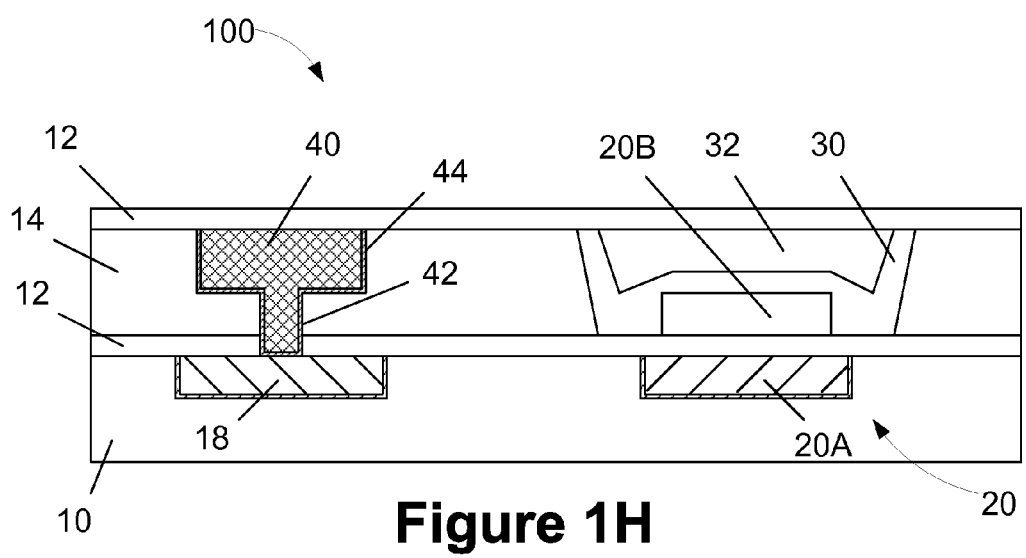

Next, as shown in FIG. 1H, a CMP process is performed to reduce the conductive structure 40 to the desired final height. Thereafter, a second non-conductive diffusion barrier layer 12 is formed above the device 100. The second non-conductive diffusion barrier layer 12 will help prevent or at least reduce any undesirable migration of the conductive materials in the conductive structure 40 and/or the top electrode 20B of the MIM capacitor 20. In one illustrative embodiment, the second non-conductive diffusion barrier layer 12 may be a layer of NBLoK™ having a thickness of about 20-40 nm that is initially formed by performing a CVD process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a first conductive structure and a bottom electrode of a capacitor in a first insulating layer, said first conductive structure completely filling a first trench and said bottom electrode completely filling a second trench;

forming a non-conductive diffusion barrier layer above said first insulating layer, said non-conductive diffusion barrier layer comprising a first portion that is formed directly on an entire upper surface of said first conductive structure and a second portion that is formed directly on an entire upper surface of said bottom electrode;

forming a layer of conductive material above said non-conductive diffusion barrier layer, wherein said layer of conductive material is formed directly on an upper surface of said second portion and a second insulating layer separates said layer of conductive material from said first portion;

performing a first etching process on said layer of conductive material to define a conductive material hard mask that is positioned above said second insulating layer and said first portion and a top electrode of said capacitor that is positioned above said bottom electrode, said second portion separating and electrically isolating said top electrode from said bottom electrode;

performing a second etching process on said conductive material hard mask to form a hard mask opening; and forming a contact opening in said second insulating layer through said hard mask opening, said contact opening extending through said first portion and exposing said first conductive structure.

2. The method of claim 1, wherein said layer of conductive material is a metal layer comprising at least one of titanium, tantalum, titanium nitride, and tantalum nitride.

3. The method of claim 1, wherein forming said first conductive structure comprises forming a conductive metal line.

4. The method of claim 1, further comprising forming a second conductive structure in said contact opening, said second conductive structure conductively contacting said first conductive structure.

5. The method of claim 4, wherein forming said second conductive structure comprises forming a conductive copper line and a conductive copper via using a damascene process.

6. The method of claim 1, wherein forming said bottom electrode comprises forming a copper conductive structure using a damascene process.

7. The method of claim 1, further comprising performing a chemical mechanical polishing process to reduce a height of said second conductive structure.

8. The method of claim 1, wherein forming at least one of said first conductive structure and said bottom electrode comprises forming one or more barrier material layers inside of a respective trench and forming a further conductive material above said one or more barrier material layers so as to completely fill said respective trench.

9. The method of claim 1, further comprising:
prior to forming said layer of conductive material, forming a second insulating layer above said non-conductive diffusion barrier layer;
performing a third etching process to form a capacitor opening in said second insulating layer and above said bottom electrode, a bottom of said capacitor opening exposing said second portion of said non-conductive diffusion barrier layer, wherein forming said layer of conductive material above said non-conductive diffusion barrier layer comprises forming said layer of conductive material inside of said capacitor opening.

10. A method, comprising:
forming first and second trenches in a first layer of insulating material, wherein said first trench is laterally separated from said second trench by a portion of said first layer of insulating material;
forming a first conductive structure in said first trench and a bottom electrode of a capacitor in said second trench, wherein said first conductive structure completely fills said first trench and said bottom electrode completely fills said second trench;
forming a non-conductive metal diffusion barrier layer above said first layer of insulating material, a first portion of said non-conductive metal diffusion barrier layer continuously covering an entire upper surface of said first conductive structure and a second portion of said non-conductive metal diffusion barrier layer continuously covering an entire upper surface of said bottom electrode;
forming a second layer of insulating material above said non-conductive metal diffusion barrier layer;
forming first opening in said second layer of insulating material and above said bottom electrode, said second portion being exposed at a bottom of said first opening;
forming a top electrode of said capacitor at said bottom of said opening, said second portion separating and electrically isolating said top electrode from said bottom electrode;
forming a metal hard mask above said second layer of insulating material, said metal hard mask being positioned above at least said first portion and said first conductive structure;
performing an etching process to form a second opening in said metal hard mask;
performing a damascene process to form a second conductive structure through said second opening in said metal hard mask, wherein said second conductive structure conductively contacts said first conductive structure.

11. The method of claim 10, wherein forming said top electrode and said metal hard mask comprises:
forming a metal layer above said second layer of insulating material and inside of said first opening, said metal layer covering said bottom of said first opening;
forming a patterned etch mask layer above said metal layer; and
performing a second etch process to form said top electrode and said metal hard mask from said metal layer by removing portions of said metal layer exposed by said patterned etch mask layer.

12. The method of claim 11, wherein said metal layer comprises at least one of titanium, tantalum, titanium nitride, and tantalum nitride.

13. The method of claim 10, wherein forming said first conductive structure comprises forming a conductive metal line.

14. The method of claim 10, wherein forming said second conductive structure comprises forming a conductive copper line and a conductive copper via.

15. The method of claim 10, wherein forming said bottom electrode comprises forming a copper conductive structure using a damascene process.

16. The method of claim 10, further comprising performing a chemical mechanical polishing process to reduce a height of said second conductive structure.

17. The method of claim 10, further comprising forming at least a first layer of a barrier material on exposed surfaces of said first and second trenches prior to forming said first conductive structure in said first trench and said bottom electrode in said second trench.

18. The method of claim 10, further comprising, prior to performing said second etching process to form said second opening in said metal hard mask, forming a third layer of insulating material above said top electrode and said metal hard mask, said third layer of insulating material completely filling said first opening.

19. The method of claim 18, further comprising, prior to forming said third layer of insulating material, forming a hard mask layer inside of said opening and above said second layer of insulating material, said hard mask layer covering an entire upper surface of said top electrode and an entire upper surface of said metal hard mask.

20. A method, comprising:

forming a first conductive structure and a bottom electrode of a capacitor in a first layer of insulating material, said first conductive structure and said bottom electrode being formed in and completely filling laterally spaced apart first and second trenches, respectively, that are separated by at least a portion of said first layer of insulating material;

forming a non-conductive barrier layer above said first layer of insulating material, said non-conductive barrier layer extending over and completely covering an entire upper surface of said first conductive structure and an entire upper surface of said bottom electrode;

forming a continuous metal layer above said non-conductive barrier layer, said metal layer comprising at least one of titanium, tantalum, titanium nitride, and tantalum nitride;

performing a first etching process on said continuous metal layer so as to define a metal hard mask and a top electrode of said capacitor, wherein said metal hard mask is positioned above a second layer of insulating material and a first portion of said non-conductive barrier layer and said top electrode is positioned above a second portion of said non-conductive barrier layer, wherein said first portion covers said entire upper surface of said first conductive structure and said second portion covers said entire upper surface of said bottom electrode;

performing a second etching process to form a hard mask opening in said metal hard mask; and forming a contact opening in said second layer of insulating material through said hard mask opening, said contact opening extending through and said first portion and exposing said first conductive structure.

21. The method of claim 20, wherein forming said first conductive structure comprises forming a conductive metal line.

22. The method of claim 20, further comprising forming a second conductive structure in said contact opening, said second conductive structure conductively contacting said first conductive structure and comprising a conductive copper line and a conductive copper via.

* * * * *